(12) United States Patent
Pechstein et al.

(10) Patent No.: US 11,187,735 B2
(45) Date of Patent: Nov. 30, 2021

(54) ASSEMBLY WITH ONE SECONDARY COIL FOR A FIELD DEVICE WITH ONE INDUCTIVE INTERFACE

(71) Applicant: Endress+Hauser Conducta GmbH+Co. KG, Gerlingen (DE)

(72) Inventors: Torsten Pechstein, Radebeul (DE); Stefan Paul, Döbeln (DE); Jörg Uhle, Limbach-Oberfrohna (DE); Sven-Matthias Scheibe, Reichenberg (DE); Thomas Nagel, Dresden (DE); Christian Fanselow, Geringswalde (DE); Alexander Serfling, Leipzig (DE)

(73) Assignee: Endress+Hauser Conducta GmbH+Co. KG, Gerlingen (DE)

( * ) Notice: Subject to any disclaimer, the term of this patent is extended or adjusted under 35 U.S.C. 154(b) by 188 days.

(21) Appl. No.: 16/560,257

(22) Filed: Sep. 4, 2019

(65) Prior Publication Data

US 2020/0081046 A1 Mar. 12, 2020

(30) Foreign Application Priority Data

Sep. 10, 2018 (DE) ..................... 10 2018 122 015.4

(51) Int. Cl.
*G01R 27/26* (2006.01)
*G01D 11/24* (2006.01)
(Continued)

(52) U.S. Cl.
CPC .......... *G01R 27/2611* (2013.01); *G01D 11/24* (2013.01); *G01N 27/025* (2013.01);
(Continued)

(58) Field of Classification Search
CPC .... G01R 27/2611; G01D 11/24; G08C 17/04; G08C 19/06; G01N 27/025; H01F 38/14; H05K 1/18; H02M 1/44; H04Q 2209/40
See application file for complete search history.

(56) References Cited

U.S. PATENT DOCUMENTS

| 8,484,829 B2 * | 7/2013 | Manoukian ............. H01F 5/003 29/602.1 |
| 2010/0006327 A1 * | 1/2010 | Yu ........................ H05K 3/4007 174/258 |

(Continued)

FOREIGN PATENT DOCUMENTS

| CN | 1415866 A | 5/2003 |
| CN | 105978044 A | 9/2016 |

(Continued)

*Primary Examiner* — Christopher P McAndrew
*Assistant Examiner* — Zannatul Ferdous
(74) *Attorney, Agent, or Firm* — Mark A. Logan; Endress+Hauser (USA) Holding Inc.

(57) ABSTRACT

An assembly with a secondary coil arranged on a coil carrier for a field device is described, wherein the field device comprises an electronics and an inductive interface connected to the electronics, and wherein the assembly can be used in the field device such that the field device can be connected via its interface to an inductive interface of a superordinate unit such that the secondary coil of the assembly, with a primary coil of the inductive interface of the superordinate unit, form a transformer for transmitting data and/or energy, which makes it possible to reduce the dimensions of field devices equipped with it and also contributes to increased operational safety, in that an assembly circuit formed by the secondary coil and at least one electronic component connected to the secondary coil via lines connected to it and arranged on the coil carrier is arranged on the coil carrier.

16 Claims, 5 Drawing Sheets

(51) Int. Cl.
*G08C 17/04* (2006.01)
*G01N 27/02* (2006.01)
*H02M 1/44* (2007.01)
*G08C 19/06* (2006.01)
*H01F 38/14* (2006.01)
*H05K 1/18* (2006.01)

(52) U.S. Cl.
CPC .............. *G08C 17/04* (2013.01); *G08C 19/06* (2013.01); *H01F 38/14* (2013.01); *H02M 1/44* (2013.01); *H05K 1/18* (2013.01); *H04Q 2209/40* (2013.01)

(56) References Cited

U.S. PATENT DOCUMENTS

| | | | | |
|---|---|---|---|---|
| 2010/0313666 | A1* | 12/2010 | Roether | .................. G01L 19/00 |
| | | | | 73/700 |
| 2014/0361634 | A1* | 12/2014 | Scholz | ................. H04B 5/0093 |
| | | | | 307/104 |
| 2018/0259593 | A1* | 9/2018 | Corum | ............... G01R 33/0047 |
| 2019/0312525 | A1* | 10/2019 | Nakao | ..................... H02M 7/06 |

FOREIGN PATENT DOCUMENTS

| | | | | |
|---|---|---|---|---|
| CN | 207486182 | U | 6/2018 | |
| DE | 102013114135 | A1 * | 6/2015 | ............. H04L 27/04 |
| DE | 102013114135 | A1 | 6/2015 | |
| DE | 102017101891 | A1 | 4/2018 | |
| JP | 07235411 | A | 9/1995 | |
| JP | 2007123772 | A | 5/2007 | |
| JP | 2003142327 | A | 5/2013 | |

* cited by examiner

ASSEMBLY WITH ONE SECONDARY COIL FOR A FIELD DEVICE WITH ONE INDUCTIVE INTERFACE

CROSS-REFERENCE TO RELATED APPLICATION

The present application is related to and claims the priority benefit of German Patent Application No. 10 2018 122 015.4, filed on Sep. 10, 2018, the entire contents of which are incorporated herein by reference.

TECHNICAL FIELD

The present disclosure relates to an assembly with a secondary coil arranged on a coil carrier for a field device, wherein the field device comprises electronics and an inductive interface connected to the electronics, and wherein the assembly can be used in the field device in such a way that the field device can be connected via its interface to an inductive interface of a superordinated unit in such a way that the secondary coil of the assembly together with a primary coil of the inductive interface of the superordinated unit forms a transducer for transmitting data and/or energy.

Field devices include measuring instruments and sensors, which are already used today in a wide variety of applications in measurement and automation technology, as well as in analysis technology for measuring quantities that can be measured by means of the respective device.

These field devices usually comprise electronics and an interface connected to the electronics via which the field device can be connected to a superordinated unit, such as a measuring transducer or transmitter, in such a way that the field device can be supplied with energy by the superordinated unit and/or that data can be transmitted from the field device to the superordinated unit and/or from the superordinated unit to the field device.

DE 10 2013 114 135 A1 describes a field device which comprises electronics and an inductive interface which is connected to the electronics and is equipped with a secondary coil and can be connected via its interface to an inductive interface of a superordinated unit in such a way that the secondary coil together with a primary coil of the inductive interface of the superordinated unit forms a transducer for transmitting data and/or energy.

In addition, DE 10 2013 114 135 A1 describes the interfaces of the field device and the superordinated unit as inductively coupling plug connections. In this case, the interfaces comprise mutually complementary, mechanically interconnectable connecting elements, in each of which one of the two coils of the transducer is arranged in such a way that the mechanical connection of the connecting elements via the two coils simultaneously also brings about the inductive coupling.

There are a large number of applications in which field devices with the smallest possible dimensions are preferably used. This is especially the case with field devices designed as sensors. At the same time, the demands placed on the performance and operational reliability of these field devices are increasing, which means that field devices are becoming increasingly complex and therefore require a lot of space in terms of electronics.

These electronics regularly include components and/or partial circuits that are not relevant for the actual function of the field device but are nevertheless required for its operation.

An example of this is components or partial circuits of the electronics which serve to suppress electromagnetic interference.

Another example of this are partial circuits that enable the use of the field devices in explosion-prone areas. In explosion-prone areas, special safety regulations apply which have the objective of avoiding sparking, which could possibly cause an explosion. Such explosion protection can be achieved, for example, by designing the field devices as intrinsically safe devices. Intrinsically safe devices are devices in which the values for the electrical variables current, voltage and power in the device are below a specified limit value at all times. The three limit values are selected so that in the event of a fault, e. g. a short circuit, the maximum energy released is not sufficient to generate an ignition spark or overheating. This limitation is usually achieved by equipping the electronics of these field devices with a limitation circuit on the input side which causes a corresponding limitation of current, voltage and power.

To accommodate these components and/or partial circuits, additional space is required in the field device, which is therefore no longer available for circuit parts of the electronics that are relevant for the actual function of the field device and thus ultimately leads to an increase in the dimensions of the field device.

SUMMARY

It is an object of the present disclosure to specify an assembly with a secondary coil arranged on a coil carrier, which enables a reduction of the dimensions of field devices equipped with it and preferably also contributes to increased operational safety.

For this purpose, the present disclosure comprises an assembly with a secondary coil arranged on a coil carrier for a field device, wherein the field device comprises electronics and an inductive interface connected to the electronics, and wherein the assembly can be used in the field device in such a way that the field device can be connected via its interface to an inductive interface of a superordinated unit in such a way that the secondary coil of the assembly together with a primary coil of the inductive interface of the superordinated unit forms a transducer for transmitting data and/or energy, which is characterized in that an assembly circuit is arranged on the coil carrier, which assembly circuit is formed by the secondary coil and by at least one electronic component that is arranged on the coil carrier and connected to the secondary coil via lines connected thereto.

Assemblies according to the present disclosure offer the advantage that their functionally comparatively large coil carrier, which is required anyway, is also used as a circuit carrier for accommodating components. Thus, neither an additional printed circuit board in the field device nor additional space on a printed circuit board arranged in the field device is required for these assemblies. The space savings achieved as a result mean that field devices equipped with assemblies according to the present disclosure can have correspondingly small overall dimensions.

A further advantage is that the shaping of the coil carrier is freely selectable within very wide limits and can thus be optimally adapted to the conditions in the field device. This can also result in further space savings, allowing the dimensions of the field device to be kept small.

In addition, the present disclosure offers the advantage in terms of manufacturing technology that the assemblies can be prefabricated, and their assembly circuits can be tested independently of the electronics to be attached to them in the field device before they are used in the field device.

First developments of the assembly are characterized in that the coil carrier is designed as an injection-molded circuit carrier having, at least in sections, metallic conductor tracks which are applied thereto and/or introduced therein, and which form the secondary coil and the lines, or the coil carrier is designed as a three-dimensional plastic body on which a flexible printed circuit board equipped with the components of the assembly circuit and comprising the secondary coil and the lines is arranged.

Second developments are characterized in that the coil carrier comprises an essentially cylindrical carrier region carrying the secondary coil, which has a shape adapted to a shape of an interface housing of the field device used to receive the secondary coil, the coil carrier comprises at least one extension adjoining to the carrier region thereof, equipped with at least one of the components or comprising a mounting surface equipped with components, the secondary coil is arranged on a partial region of the cylindrical carrier region which has a smaller outer diameter than the regions of the cylindrical carrier region adjacent thereto on both sides, and/or the assembly comprises contact pins that are connected to the assembly circuit via lines disposed at least in sections on or in the coil carrier and that are encapsulated with plastic or extrusion-coated with plastic, via which the assembly circuit can be connected to the electronics of the field device.

Third developments are characterized in that the assembly circuit comprises at least one component arranged on an essentially cylindrical carrier region carrying the secondary coil and/or at least one component arranged on an extension of the coil carrier molded onto the essentially cylindrical carrier region carrying the secondary coil, the components of the assembly circuit are each designed as a component applied to the coil carrier by means of an SMD soldering method, by means of a conductive adhesive or by thermocompression bonding, and/or the coil carrier comprises at least one cavity in which at least one component of the assembly circuit is arranged.

Fourth developments are characterized in that an electrically insulating covering layer is arranged on the secondary coil and/or on at least one or all of the line segments of the lines arranged on an outer circumferential surface of the coil carrier, and/or a cover covering the respective component, namely an electrically insulating cover, a lacquer layer, a plastic layer or resin introduced into a cavity surrounding the component and arranged in the coil carrier, is arranged on at least one or all components of the assembly circuit.

Fifth developments are characterized in that the assembly circuit comprises a circuit downstream of the secondary coil for suppressing electromagnetic interference and/or a component in the form of a ferrite connected in series with the secondary coil, comprises a limiting circuit downstream of the secondary coil for limiting current, voltage and/or power, and/or has an adjustment circuit connected downstream of the secondary coil, which comprises at least one component of the assembly circuit designed as an adjustment element and designed in such a way that it causes at least one electrical property of the assembly circuit to have a value specified for this.

A further development of an assembly according to the third alternative of the fifth development is characterized in that the adjustment elements comprise an adjustment resistor connected in series with the secondary coil, the resistance value of which is dimensioned such that the assembly circuit has a specified total resistance, and/or comprise an adjustment capacitor connected in parallel with the secondary coil, the capacitance value of which is dimensioned such that the assembly circuit has a specified total capacitance.

A sixth development is characterized in that the assembly circuit comprises a circuit connected downstream of the secondary coil, which circuit is designed in such a way that it effects a limitation of current, voltage and/or power and which is designed in such a way that it causes at least one electrical property of the assembly circuit to have a value specified for it.

Furthermore, the present disclosure comprises a field device having an assembly according to the present disclosure, characterized in that the field device comprises electronics connected to the assembly, the field device comprises an inductive interface via which the field device can be connected to an inductive interface of a superordinated unit comprising a primary coil, and the interface comprises an interface housing into which the assembly is inserted in such a way that the field device can be connected to the superordinated unit via the interfaces of the field device and the superordinated unit such that the secondary coil of the assembly, together with the primary coil of the interface of the superordinated unit, forms a transducer for transmitting data and/or energy.

A first development of the field device is characterized in that the electronics comprise a printed circuit board which is arranged in an electronics housing and is equipped with electronic components on one side or on both sides, an interior of the electronics housing is directly adjacent to an interior of the interface housing, and the assembly:

a) comprises contact pins, the conductive ends of which are connected to terminal contacts provided on the printed circuit board and/or are soldered onto the terminal contacts by soldering joints also serving to mechanically fasten the printed circuit board, b) comprises at least one extension which extends into the electronics housing and is equipped with at least one component of the assembly circuit and has a shape adapted to a shape of the electronics housing, and/or c) comprises a plug-in device into which the printed circuit board is inserted.

A second development of the field device is characterized in that the assembly comprises at least one extension which extends essentially parallel to the printed circuit board into the electronics housing and has a mounting surface equipped with at least one component of the assembly circuit on a side facing the printed circuit board.

Third developments of the field device are characterized in that the interface of the field device comprises a connecting element which can be mechanically connected to a complementary connecting element of the interface of the superordinated unit in such a way that an inductive coupling exists via the secondary coil of the assembly arranged in the connecting element of the field device and the primary coil arranged in the connecting element of the superordinated unit, and/or the interior of the electronics housing and/or an adjoining interior of the interface housing is encapsulated with resin.

The present disclosure further comprises a method for producing one or more field devices according to the present disclosure, characterized in that a number of assemblies corresponding to the number of field devices is prefabricated by manufacturing their coil carriers including the secondary coil arranged thereon and the lines required for connecting the components of the assembly circuit and equipping the coil carrier with the components, and each assembly is respectively inserted into one of the field devices and its assembly circuit is connected to the electronics of the field device.

A further development of the method is characterized by the fact that an adjustment method is carried out within the framework of the manufacture of the respective assembly, with a total value of at least one electrical property of the assembly circuit being adjusted by a corresponding dimensioning of at least one component of the assembly circuit which serves as an adjustment element for adjusting the respective property and is to be arranged on its coil carrier in such a way that it is essentially equal to a specified value for the respective assembly, the at least one electrical property comprising a total resistance of the assembly circuit and/or a total capacitance of the assembly circuit.

A further development of the aforementioned development is characterized by the fact that in the manufacture of multiple field devices, the procedure is such that identical electronics are prefabricated, identical assemblies adjusted by means of the adjustment method are prefabricated, and the adjusted assemblies are each used directly in one of the field devices in combination with one of the identical electronics without the respective electronics being adapted to the respective assembly.

BRIEF DESCRIPTION OF THE DRAWINGS

The present disclosure and its advantages will now be explained in detail using the figures in the drawing which show two exemplary embodiments. The same elements are indicated by the same reference numbers in the figures.

DETAILED DESCRIPTION

Figure 1:
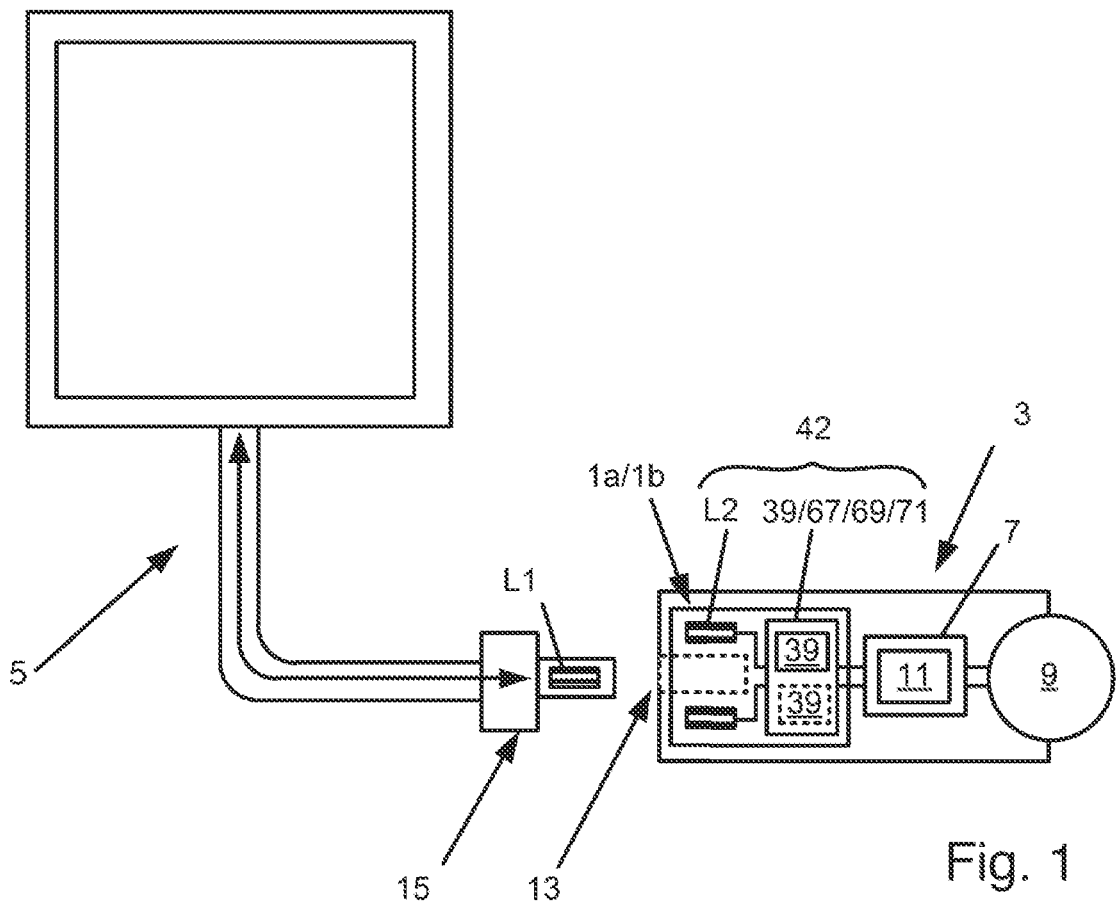
FIG. 1 shows a measuring system with a field device and a superordinated unit which can be connected to it.

The present disclosure relates to an assembly having a secondary coil arranged on a coil carrier for a field device, a field device equipped with an assembly according to the present disclosure, and a method for manufacturing one or more of these field devices. The present disclosure can be used in field devices which comprise electronics and an inductive interface connected to the electronics. The assemblies which can be used in these field devices are designed such that they can be used in the respective field device in such a way that the field device can be connected via its interface to an inductive interface of a superordinated unit in such a way that the secondary coil, together with a primary coil of the inductive interface of the superordinated unit, forms a transducer for transmitting data and/or energy. For illustration purposes, FIG. 1 shows a schematic representation of a measurement system that comprises a field device 3 equipped with an assembly 1a or 1b according to the present disclosure and a superordinated unit 5 that can be connected to it.

The present disclosure can be used, for example, in field devices 3 which are designed as a sensor or as a measuring device. In this case, the field device 3 comprises a measuring device 9, which is also shown in FIG. 1 and is connected to its electronics 7, such as e. g. a sensor element for the metrological acquisition of a measured variable, and the electronics 7 comprises a measuring circuit 11, via which the measuring device 9 is supplied with energy and which is designed in such a way that it generates a measured value of the measured variable that was measured and/or an electrical signal reproducing the measured value during measuring operation.

Figure 2:
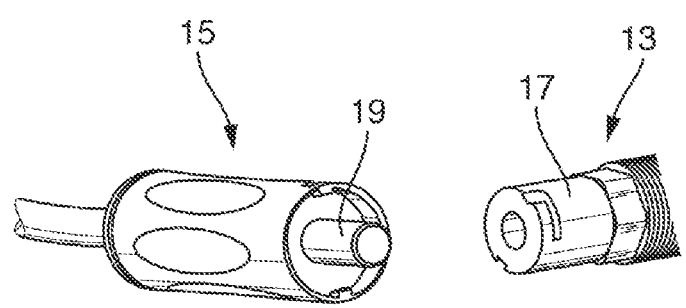
FIG. 2 shows interfaces formed as a plug-in connection.

Optionally, the interfaces 13, 15 of the field device 3 and of the superordinated unit 5 can be designed as inductively coupling plug-in connections which comprise mutually complementary connecting elements 17, 19 which can be connected mechanically to one another. FIG. 2 shows, as an example, connecting elements 17, 19 which can be connected to one another by a bayonet connection. In each of the connecting elements 17, 19 one of the two coils of the transformer is arranged in such a way that the mechanical connection of the connecting elements 17, 19 also simultaneously effects an inductive coupling of the two coils forming the transducer.

Figure 3:
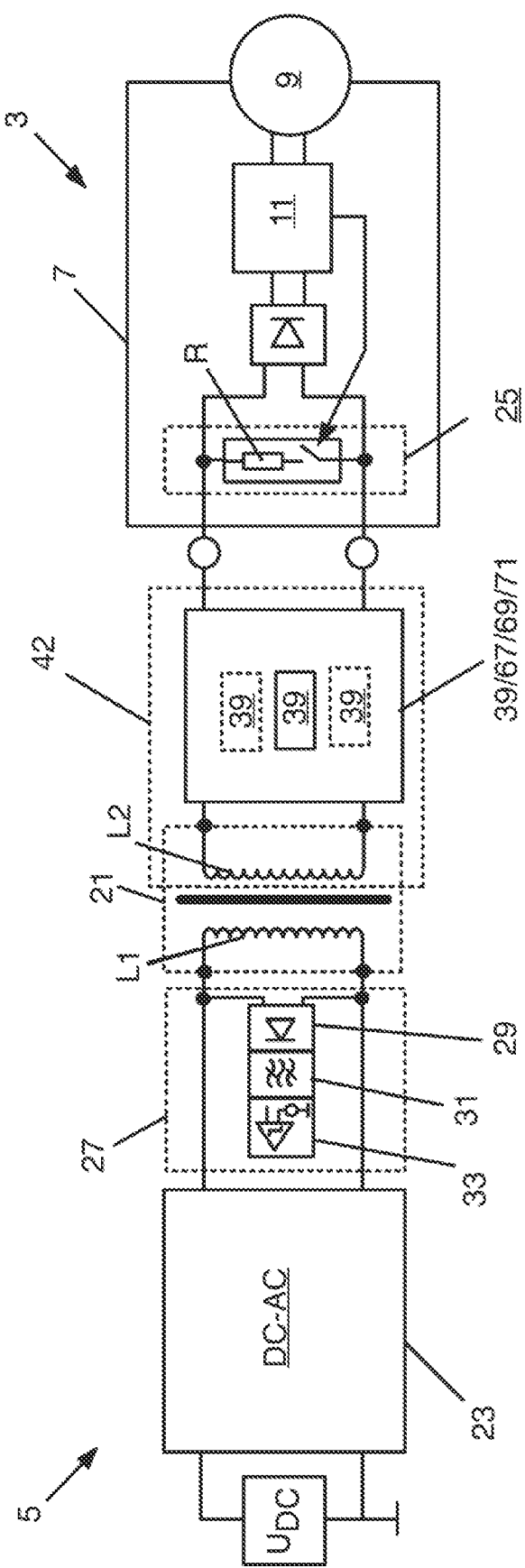
FIG. 3 shows a block diagram of the measuring system of FIG. 1.

The field device 3 and the superordinated unit 5 are designed in such a way that energy and/or data can be transmitted via the transducer comprising the primary coil L1 and the secondary coil L2 coupled to it. For this purpose, field device 3 and superordinated unit 5 can comprise state of the art circuits which enable energy transmission and/or data transmission. FIG. 3 shows, as an example, a substitute circuit diagram of a measuring system comprising the superordinated unit 5 and the field device 3 connected to it, in which the superordinated unit 5 supplies the field device 3 with energy and the field device 3 transmits data in the form of useful signals to the superordinated unit 5, which signals are generated by amplitude modulation of a carrier signal transmitted by the superordinated unit 5 via the transducer 21 and serving to power the field device 3. This data can comprise, for example, measured values determined by means of the measuring circuit 11 connected to the measuring device 9.

The superordinated unit 5, shown here as an example, comprises a carrier signal generator having a direct voltage source UDC and a DC-AC converter 23 downstream of the direct voltage source UDC, at the output of which a carrier signal having a carrier signal frequency set by the DC-AC converter 23 is provided. The electronics 7 of the field device 3 connected to the secondary coil L2 comprise a modulator 25 for modulating the amplitude of the carrier signal. The latter comprises a load R connected in parallel with the secondary coil L2, which load is connected via a controllable switch, here not designated in detail, that is disposed upstream of the load R, at times specified by the digital useful signal to be transmitted by the field device 3. The connection of the load R produces a sudden voltage drop of the voltage dropping via the primary coil L1. Accordingly, a demodulator 27 connected in parallel to the primary coil L1 is used to extract the useful signal. The voltage dropping via the primary coil L1 is applied to its inputs. The demodulator 27 comprises a rectifier 29, a bandpass filter 31 downstream of the rectifier 29, and a comparator 33 with an adjustable comparator threshold downstream of the bandpass filter 31, at the output of which an information signal reflecting the received useful signal is provided. Alternatively, however, other state of the art suitable for transmitting energy and/or data can also be used. These include, in particular, circuits for transmitting energy from the superordinated unit to the field device and/or for transmitting data from the field device to the superordinated unit and/or from the superordinated unit to the field device.

Figure 4:
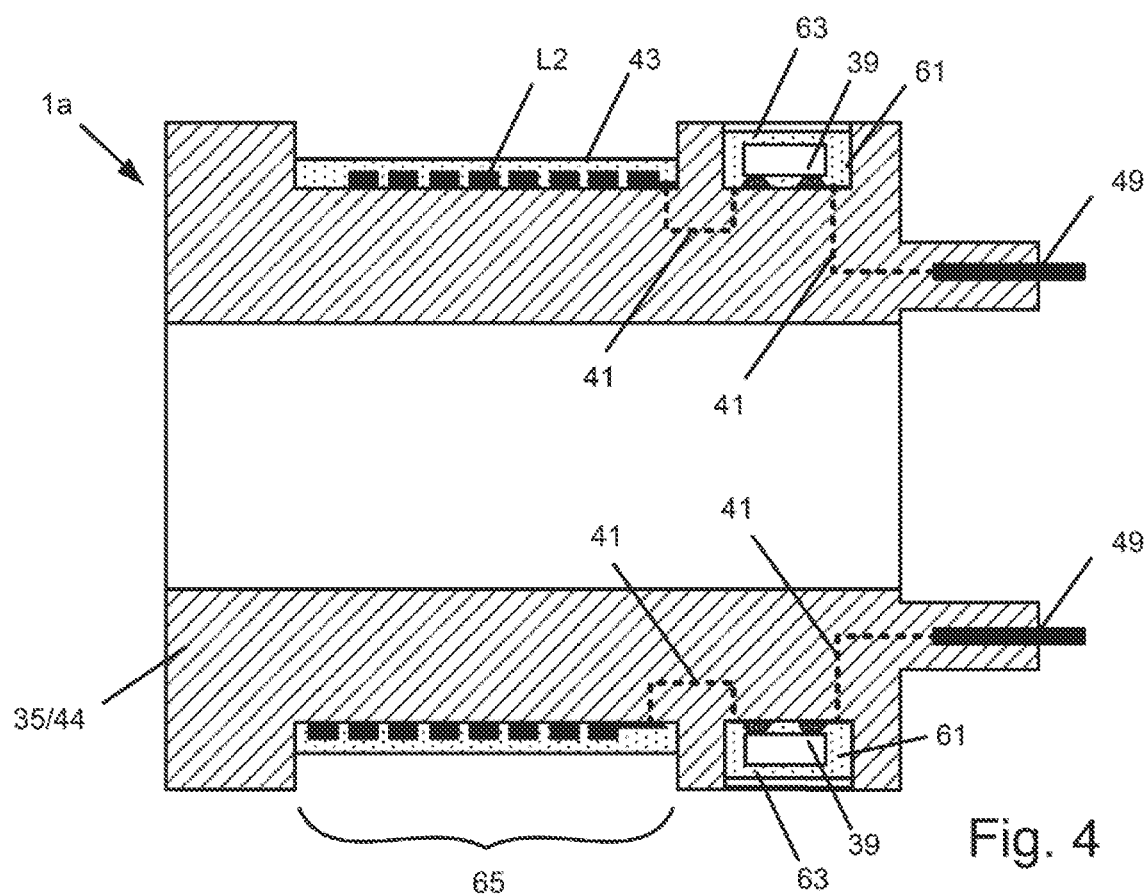
FIG. 4 shows a first example of an assembly.
Figure 5:
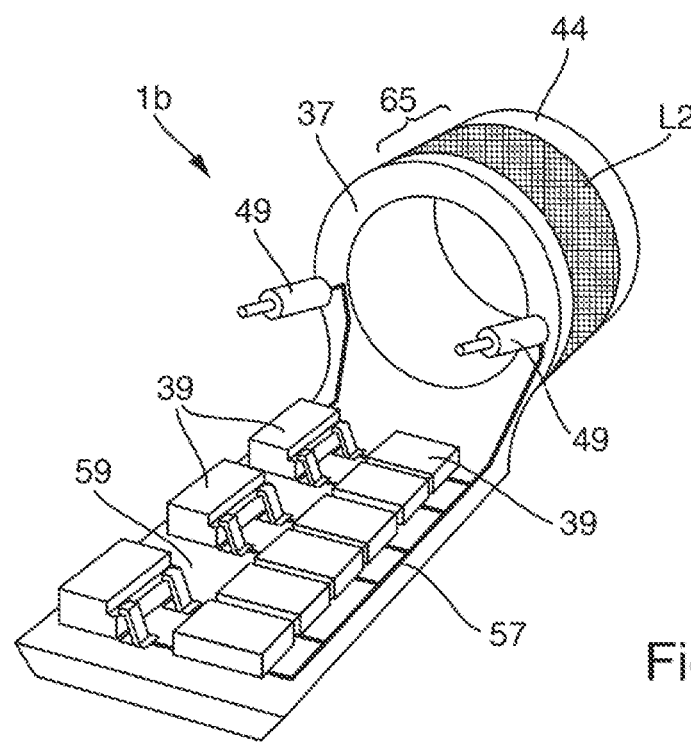
FIG. 5 shows a second example of an assembly.

FIG. 4 and FIG. 5 each show an example of an assembly 1a, 1b usable in the field device 3 shown in FIG. 1. Assemblies 1a, 1b according to the present disclosure are characterized in that on their coil carrier 35, 37 there is arranged a assembly circuit 42 formed by the secondary coil L2 and at least one electronic component 39 connected to the secondary coil L2 via lines 41 connected to it and arranged on the coil carrier 35, 37.

These assemblies 1a, 1b as well as field devices 3 equipped therewith have the advantages already mentioned above. Individual components of the assembly 1a, 1b and/or of the field device 3 comprising the assembly 1a, 1b can optionally have individually and/or in combination with each other usable features described in detail below.

Thus, the coil carrier can be designed, for example, as a three-dimensional plastic body, on which a flexible printed circuit board equipped with the components of the assembly circuit and comprising the secondary coil and the lines is arranged.

Figure 6:
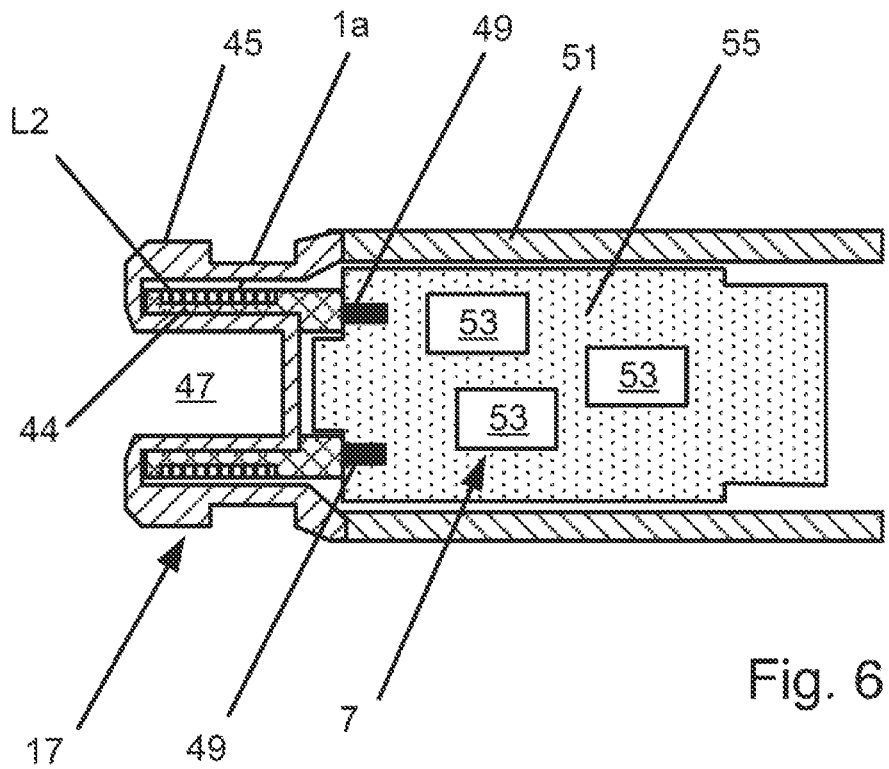
FIG. 6 shows a section of a field device comprising the assembly of FIG. 4.

Alternatively, the coil carrier 35, 37 can be designed as an injection-molded circuit carrier in accordance with a currently preferred embodiment shown in FIGS. 5 and 6, with metallic conductor tracks at least in sections applied thereto and/or inserted therein and forming the secondary coil L2 and the lines 41.

For the production of these coil carriers 35, 37, state-of-the-art methods can be used for the production of injection-molded circuit carriers, also known as Molded Interconnect Device (MID), such as two-component injection molding or laser direct structuring. In a two-component injection molding, a base body is produced from a first plastic, onto which a metallizable plastic is then applied. The surface of the metallizable plastic is subsequently activated and plated galvanically with a metallization forming the conductor tracks. In laser direct structuring, the base body is made of a thermoplastic material doped with a laser-activatable metal compound. Here, the surfaces of the base body activated by a laser are also galvanically coated with a metallization forming the conductor tracks.

Assemblies comprising a flexible printed circuit board as well as assemblies 1a, 1b whose coil carriers 35, 37 are designed as injection-molded circuit carriers offer the advantage over coil carriers wound with a coil wire that wire breaks are excluded.

Optionally, an electrically insulating covering layer 43, such as a lacquer layer or a plastic layer, can be arranged on the secondary coil L2 and/or on at least one or all line segments of the lines 41 arranged on a given circumferential surface of the coil carrier 35, 37. FIG. 4 shows, as an example of this, a covering layer 43 applied as a coating to the secondary coil L2. In this way, especially short circuits which can be caused by moisture are avoided.

The above-mentioned embodiments achieve a high degree of operational safety and reliability of the assemblies 1a, 1b and thus also of the field devices 3 equipped with them.

Preferably, the coil carrier 35, 37 comprises an essentially cylindrical carrier region 44 carrying the secondary coil L2, which carrier region has a shape adapted to a shape of an interface housing 45 of the field device 3 used to receive the secondary coil L2.

This carrier region 44 can be designed, for example, as a region forming the coil carrier 35. This version is shown in FIG. 4. Alternatively, the carrier region 44 can be designed as a partial region of the coil carrier 37. This version is shown in FIG. 5.

Figure 7:
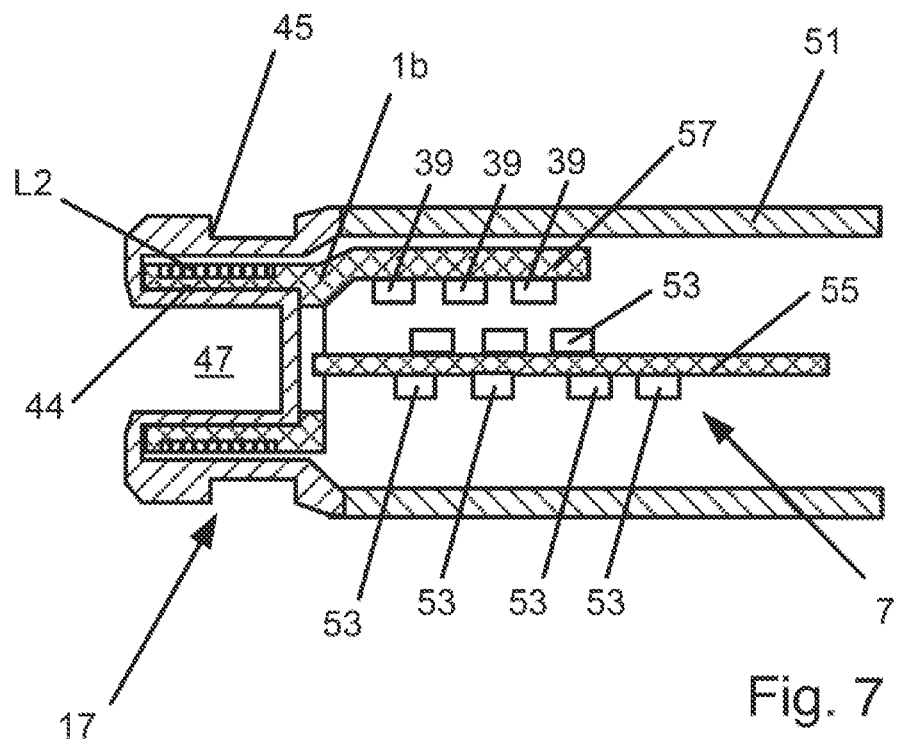
FIG. 7 shows a section of a field device comprising the assembly of FIG. 5.

FIG. 6 shows a sectional drawing of a section of a field device 3 which comprises the interface housing 45, the assembly 1a shown in FIG. 4 and the connected electronics 7 of the field device 3. FIG. 7 shows a sectional drawing of a section of a field device 3 which comprises the interface housing 45, the assembly 1b shown in FIG. 5 and the connected electronics 7 of the field device 3. In these examples, the interface housing 45 surrounds an essentially cylindrical interior in which the cylindrical carrier region 44 of the respective coil carrier 35, 37 is arranged. In addition, it comprises an interface opening 47 which is accessible from the outside, surrounded on all sides on the outside by an inner housing wall region of the interface housing 45 which surrounds the carrier region 44, and into which an area, comprising the primary coil L1, of the connecting element 19 of the superordinated unit 5 which is complementary to the connecting element 17 of the field device 3 and shown in FIG. 2 can be inserted from the outside.

As an alternative or in addition, the assembly 1a, 1b preferably comprises contact pins, coated or encapsulated in plastic, 49 which are connected to the assembly circuit 42 formed by the secondary coil L2 and the components 39 connected to it, and via which the assembly circuit 42 can be electrically connected to the electronics 7, via lines 41 which are arranged at least in sections on and/or in their coil carriers 35, 37. FIGS. 4 and 5 show an example in which the contact pins 49 are designed as contact pins 49 arranged on one end face of the cylindrical carrier region 44 and projecting parallel to the longitudinal axis of the carrier region 44.

In the field devices 3 shown in FIGS. 6 and 7, the electronics 7 comprise a printed circuit board 55 arranged in an electronics housing 51 and equipped on one side or on both sides with electronic components 53 of the electronics 7. In order to achieve the smallest possible field device dimensions, these electronics housings 51 preferably have an interior which is directly adjacent to the interior of the interface housing 45. In this embodiment, the electrical connection of the respective assembly 1a, 1b to the electronics 7 can be achieved, for example, by soldering the conductive ends of the contact pins 49 to connection contacts provided for this purpose on the printed circuit board 55. In doing so, a mechanical fastening of the printed circuit board 55 is also effected at the same time via the soldering joints connecting the contact pins 49 to the terminal contacts. As an alternative or in addition to the fastening effected by the soldering joints, the cylindrical carrier region 44 of the coil carrier 35, 37 can have a plug connector on its side facing the printed circuit board 55 in the field device 3, which is not shown in detail in the figures, into which the printed circuit board 55 can be inserted.

Optionally, the interior of the electronics housing 51 and preferably also the adjacent interior of the interface housing 45 can be encapsulated with a resin compound, e. g. a silicone potting compound. This offers the advantage that electrical components 39, lines 41 and electronic components 53 arranged in the respective interior are protected from moisture by the resin compound. A further advantage is that the resin also effects an additional mechanical support of the printed circuit board 55 at the same time. The latter is advantageous, in particular, since the mounting of the printed circuit board 55 is effected exclusively via the soldering.

The components 39 arranged on the coil carrier 35 may comprise, for example, at least one component 39 arranged on the cylindrical carrier region 44. One example of this is shown in FIG. 4.

Alternatively or in addition to this, the coil carrier 37 can have at least one extension 57 formed on its cylindrical carrier region 44 on which at least one of the components 39 of the assembly circuit 42 is arranged and/or which comprises a mounting surface 59 equipped with components 39 of the assembly circuit 42. An example of this is shown in FIGS. 5 and 7. There, the extension 57 is formed such that it extends into the electronics housing 51 when the assembly 1b is inserted into the field device 3. The design freedom given with regard to the shaping of the coil carrier 37 offers the advantage that the shaping of the extension 57 can be optimally adapted to the conditions in the field device 3. Thus, the extension 57 shown in FIGS. 5 and 7 is designed such that it extends in the field device 3 essentially parallel to the printed circuit board 55 into the electronics housing 51 and on its side facing the printed circuit board 55 comprises the mounting surface 59 equipped with the components 39. Optionally, the coil carrier 37 illustrated in FIGS. 5 and 7 could additionally comprise at least one further extension, not shown in the figures. Here, for example, a second extension of essentially the same shape as the first extension 57 could be integrally formed on the cylindrical carrier region 44 in such a way that in field device 3 it extends into the electronics housing 51 on a side of the printed circuit board 55 opposite the first extension 57, offset essentially parallel to the printed circuit board 55 in such a way that its mounting surface 59 is opposite the printed circuit board 55.

Coil carriers 37 comprising at least one such extension 57, in particular in conjunction with essentially cylindrical electronic housings 51, offer the advantage that interior regions of the electronics housing 51 which were not usable up to now can be used to accommodate components 39 via the extension 57 or via the extensions 57. In this way, a larger number of components 39 can easily be arranged on the coil carrier 37 without requiring an increase in the dimensions of the field device 3.

In the case of assemblies 1a, 1b according to the present disclosure, the components 39 arranged on the coil carrier 35, 37 are each electrically connected to terminal contacts provided for their electrical connection on the coil carrier 35, 37. State of the art methods can be used to produce these electrical connections. In this respect, the components 39 preferably comprise at least one component 39 applied to the coil carrier 35, 37 by an SMD soldering method, at least one component 39 adhesively bonded by means of a conductive adhesive, and/or at least one component 39 applied to the coil carrier 35, 37 by thermocompression bonding. Conductive connections produced in this way have the advantage that they do not include mechanically sensitive wires which could break off under mechanical strain such as vibration, potting, encapsulation and/or strain caused by the installation of assembly 1a, 1b.

The components 39 of the assembly circuit 42 can comprise, for example, at least one component 39 arranged on a fixed circumferential surface of the coil carrier 37. FIGS. 5 and 7 show the components 39 arranged on the mounting surface 59 of the extension 57 as an example of this. Similarly, of course, at least one component 39, not shown in the figures, can also be arranged on the outer circumferential surface of the cylindrical carrier region 44 of the coil carrier 35, 37.

Alternatively, or in addition to this, the components 39 arranged on the coil carrier 35, 37 of assemblies 1a according to the present disclosure may include at least one component 39 inserted into a cavity 61 provided in the coil carrier 35. This embodiment offers the advantage of a considerable reduction in the space required for components 39 accommodated in this way. In this case, the cavities 61 serving respectively to accommodate one or more components 39 may e.g. include cavities 61 arranged in the cylindrical carrier region 44 and/or in one or more projections 57.

As an example of this, FIG. 4 shows two components 39 which are each arranged in a cavity 61 arranged in the cylindrical carrier region 44 of the coil carrier 35.

Optionally, the robustness, fail-safety, reliability and/or operational safety of both assembly 1a, 1b and the field device 3 equipped with assembly 1a, 1b can be further improved by arranging, on at least one of the components 39, preferably on all components 39, a cover covering component 39. A suitable cover is, for example, an electrically insulating cover or a lacquer layer of electrically insulating lacquer.

The components 39 arranged in the cavities 61 are already protected by their position. Optionally, these components 39 may additionally be protected by a cover arranged over them. A suitable cover would be also an electrically insulating cover or a lacquer layer of electrically insulating lacquer. Alternatively, however, the cover 63 can also be embodied here as a potting, such as, for example, a silicone sealing, introduced into the respective cavity 61, as illustrated in FIG. 4. These embodiments offer the advantage that components 39 that are not protected by a component housing or similar measures, such as components often referred to as naked chips, can be optionally inserted into the cavities 61.

Optionally, the secondary coil L2 can be arranged on a partial region 65 of the cylindrical carrier region 44 which has a smaller outer diameter than the regions of the cylindrical carrier region 44 adjacent thereto on both sides. This provides additional protection for the secondary coil L2, as well as for the covering layer 43, which may be arranged on it, against mechanical strains, such as may occur when inserting assembly 1a, 1b into the interface housing 45

Figure 8:
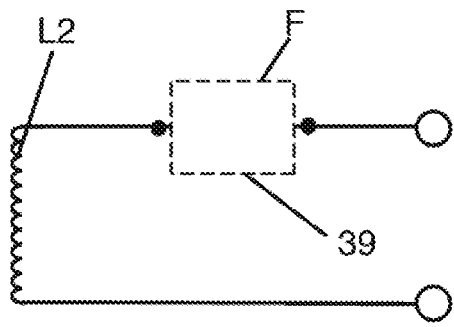
FIGS. 8 to 11 each show an example of an assembly circuit.

The assembly circuit 42 of assemblies 1a, 1b according to the present disclosure comprises at least one component 39 arranged on the coil carrier 35, 37. In this case, the assembly circuit 42 can comprise, for example, a circuit for suppressing electromagnetic interference downstream of the secondary coil L2 and/or a component 39 connected in series to the secondary coil L2 for this purpose and configured as a ferrite F. An example of an assembly circuit 42 comprising a ferrite F is shown in FIG. 8. As a result, the circuit for suppressing electromagnetic interference and/or the ferrite F effects a reduction of adverse influences of electromagnetic interference on the assembly circuit 42 and on the electronics 7 connected thereto in the field device 3

Figure 9:
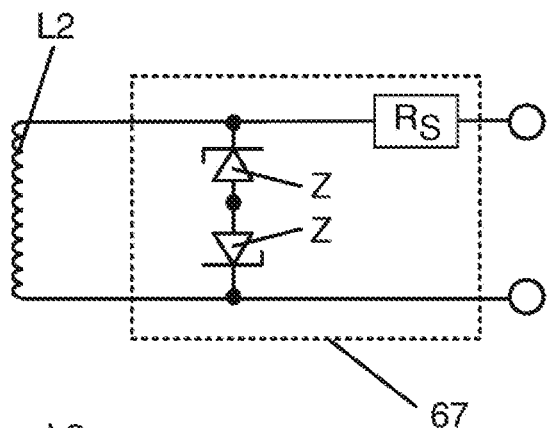

As an alternative or in addition to this, the assembly circuit 42 can comprise a limiting circuit 67 connected downstream of the secondary coil L2 for limiting current, voltage and/or power. For example, state of the art limiting circuits which limit current, voltage and/or power, are suitable for achieving the intrinsic safety of field devices, can be used as limiting circuit 67. An example of such an assembly circuit 42 is shown in FIG. 9. The limiting circuit 67 shown there comprises a transverse path connected in parallel to the secondary coil L2, in which two antiserially connected, voltage-limiting diodes Z, such as Zener diodes, are arranged, and a current limiting resistor RS connected in series with the secondary coil L2. Alternatively, instead of the limiting circuit 67 shown here, it is of course also possible to use circuits having a different structure and limiting the current, the voltage and/or the power.

Just as in the case of secondary coils used in inductive interfaces of state of the art field devices, the secondary coils L2 used in assemblies 1a, 1b according to the present disclosure also have an ohmic resistance and capacitive properties in addition to their inductance. Thereby the electrical properties of the secondary coil L2 may vary from secondary coil L2 to secondary coil L2, in particular due to manufacturing tolerances. Depending on the type of circuit topology used in the electronics 7 of the field device 3, these properties must be taken into account when designing the electronics 7. The latter, however, results in each electronics 7 being a one-off product matched to the secondary coil L2 connected to it, which means an additional logistical effort that increases the manufacturing costs. Furthermore, it is comparatively difficult and complex to determine the electrical properties of the secondary coil L2 connected to the electronics 7 in isolation, since their properties inevitably interact with the electrical properties of circuit parts of the electronics 7 connected to it.

Figure 10:
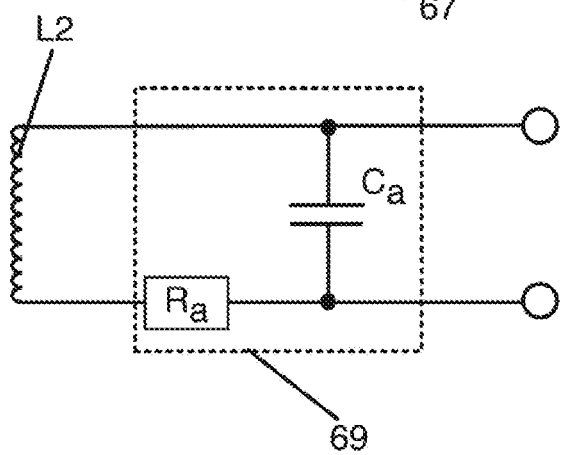

In order to solve this problem, the assembly circuit 42 may alternatively or in addition to the limiting circuit 67, the electromagnetic interference suppression circuit, and/or the ferrite F comprise an adjustment circuit 69 downstream of the secondary coil L2 which comprises at least one component 39 embodied as an adjustment element and which is designed such that it causes at least one electrical property of the assembly circuit 42 to have a value specified for this. For example, an adjustment resistor Ra which is connected in series to the secondary coil L2 and whose resistance value is dimensioned such that the assembly circuit 42 has an overall total resistance predetermined for the assembly 1a, 1b is suitable as an adjustment element. Alternatively, or additionally, an adjustment capacitor Ca connected in parallel to the secondary coil L2 can be used as adjustment element, for example, the capacitance of which is dimensioned such that the assembly circuit 42 has an overall total capacitance specified for the assembly 1a, 1b. An example of an assembly circuit 42 with an adjustment circuit 69 comprising both the adjustment resistor Ra connected in series to the secondary coil L2 and the adjustment capacitor Ca connected in parallel to the secondary coil L2 is shown in FIG. 10.

Assemblies 1a, 1b, the assembly circuit 42 of which comprises both the limiting circuit 69 described above and the adjustment circuit 69 described above, have the advantage that they can be used very universally in field devices 3 as assemblies 1a, 1b which have defined electrical properties on the basis of the adjustment circuit 69 and are intrinsically safe on the basis of the limiting circuit 69.

Optionally, synergy effects can be used with these assemblies 1a, 1b, which lead to the realization that the functionality of both circuits requires fewer components 39 in total than would be the case, if the adjustment circuit 69 described above and the limiting circuit 69 described above were connected one after another.

Figure 11:
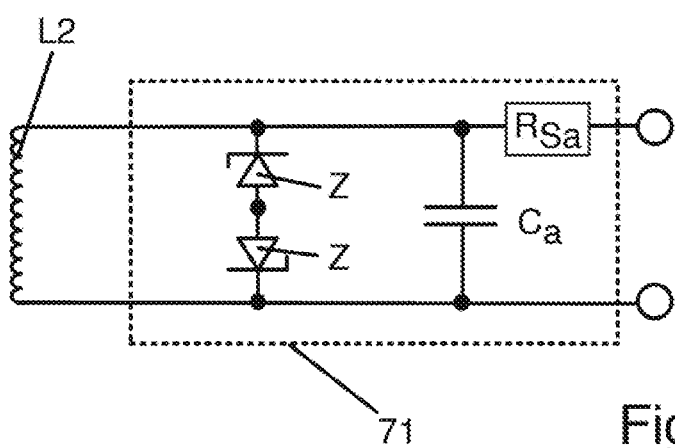

FIG. 11 shows an example of an assembly circuit 42 comprising a circuit 71 downstream of the secondary coil L2, which assumes both the function of the limiting circuit 67 and the function of the adjustment circuit 69. This circuit 71 differs from the limiting circuit 67 shown in FIG. 9 only in that instead of the current limiting resistor Rs shown in FIG. 9, a resistor Rsa is used which is dimensioned in such a way that it effects both the current limiting and at the same time assumes the function of the adjustment resistor Ra shown in FIG. 9, and the adjustment capacitor Ca connected in parallel to the secondary coil L2 has been supplemented.

In the manufacturing of one or more field devices in accordance with the present disclosure, preferably the procedure is such that a number of assemblies 1a, 1b corresponding to the number of field devices 3 is prefabricated by manufacturing their coil carriers 35, 37 including the secondary coil L2 arranged thereon and the lines 41 required for connecting the components 39 of the assembly circuit 42. The coil carriers 35, 37 are each fitted with the components 39 of the assembly circuit 42. Each assembly 1a, 1b is in each case inserted into one of the field devices 3 and their assembly circuit 42 is connected to the electronics 7 of the field device 3.

In the context of the production of assemblies 1a, 1b, the assembly circuit 42 of which comprises the adjustment circuit 69 or the circuit 71 assuming the function of the adjustment circuit 69, an adjustment method is additionally executed. In doing so, the total value of at least one electrical property of the assembly circuit 42 is adjusted by a corresponding dimensioning of at least one component 39 that serves as an adjusting element for adjusting the respective property and that is to be arranged on its coil carrier 35, 37 in such a way that it is essentially equal to a specified value for the respective assembly 1a, 1b. The electrical properties adjusted by the application of the correspondingly dimensioned adjustment elements preferably comprise the total resistance of the assembly circuit 42 and/or its total capacitance.

Assemblies 1a, 1b, the assembly circuit 42 of which comprises the adjustment circuit 69 or the circuit 71 assuming the function of the adjustment circuit 69, have the advantage, from a manufacturing point of view, that their adjustment, in particular the dimensioning of the adjustment elements to be arranged on their coil carriers 35, 37, can be carried out completely independently of the electronics 7 of the field device 3 by subsequently inserting the respective assembly 1a, 1b.

Furthermore, they offer the advantage that they have correspondingly defined electrical properties on account of the adjustment. The latter offers the advantage that assemblies 1a, 1b and electronics 7 no longer have to be treated as pairs specially matched to each other in the manufacturing of field devices 3, but instead form assemblies that can be combined with each other at will without further additional measures. Correspondingly, in the production of a number of field devices 3 comprising these assemblies 1a, 1b, structurally identical electronics 7 are preferably prefabricated. Subsequently, each of the assemblies 1a, 1b adjusted by means of the adjustment method can be used directly in one of the field devices 3 in combination with one of the electronics 7 of identical construction, without the respective electronics 7 being adapted to the respective assembly 1a, 1b.

A further advantage is that, if required, assemblies 1a, 1b of these field devices 3 can be exchanged for an essentially identical assembly 1a, 1b with identical electrical properties, adjusted by the adjustment procedure, without the electronics 7 of the respective field device 3 having to be changed. The electronics 7 of these field devices 3 can, of course, also be replaced by identical electronics 7 if required.

The invention claimed is:

1. An assembly for a field device, comprising:
a coil carrier; and an assembly circuit arranged on the coil carrier, the assembly circuit including:
a secondary coil; and
at least one electronic component electrically connected to the secondary coil via conductive lines, wherein the coil carrier includes a cylindrical carrier region carrying the secondary coil, where the cylindrical carrier region has a shape adapted to a shape of an interface housing of the field device used to receive the secondary coil, wherein the coil carrier includes at least one extension adjoining the cylindrical carrier region thereof, and including the at least one electronic component or including a mounting surface including the at least one electronic component, wherein the assembly includes contact pins that are connected to the assembly circuit via lines arranged at least in sections on or in the coil carrier and that are encapsulated with plastic or are extrusion-coated with plastic, via which the assembly circuit can be connected to the electronics of the field device, wherein the field device includes electronics and an inductive interface connected to the electronics, and wherein the assembly can be used in the field device in such a way that the field device can be connected via its inductive interface to an inductive interface of a superordinate unit in such a way that the secondary coil of the assembly together with a primary coil of the inductive interface of the superordinate unit form a transformer for transmitting data and energy.

2. The assembly according to claim 1, wherein the coil carrier is designed as an injection-molded circuit carrier having metallic conductor tracks which are applied to it and/or introduced to it and which form the secondary coil and the conductive lines.

3. The assembly according to claim 1, wherein the coil carrier is embodied as a three-dimensional plastic body on which a flexible printed circuit board equipped with the at least one electronic component of the assembly circuit, the secondary coil, and the conductive lines is arranged.

4. The assembly according to claim 1, wherein the secondary coil is arranged on a partial region of the cylindrical carrier region which has a smaller outer diameter than the regions of the cylindrical carrier region adjacent to the partial region on both sides.

5. The assembly according to claim 1, wherein the assembly circuit includes the at least one component arranged on the cylindrical carrier region carrying the secondary coil and/or the at least one component arranged on an extension of the coil carrier molded onto the cylindrical carrier region carrying the secondary coil, wherein the at least one component of the assembly circuit is designed as a component applied to the coil carrier by means of a surface mounted device (SMD) soldering method, by means of a conductive adhesive, or by thermocompression bonding, and/or wherein the coil carrier comprises at least one cavity in which at least one component of the assembly circuit is arranged.

6. The assembly according to claim 1, wherein an electrically insulating covering layer is arranged on the secondary coil and/or on at least one or all of the line segments of the conductive lines arranged on an outer circumferential surface of the coil carrier, and/or wherein a cover covering the respective component, including an electrically insulating cover, a lacquer layer, a plastic layer or resin introduced into a cavity surrounding the component and arranged in the coil carrier, is arranged on at least one or all components of the assembly circuit.

7. The assembly according to claim 1, wherein the assembly circuit further includes:
a circuit downstream of the secondary coil for suppressing electromagnetic interference and/or a component in the form of a ferrite connected in series with the secondary coil, a limiting circuit downstream of the secondary coil for limiting current, voltage and/or power, and/or an adjustment circuit connected downstream of the secondary coil, which includes at least one of the at least one component of the assembly circuit designed as an adjustment element, and is designed in such a way that it causes at least one electrical property of the assembly circuit to have a value specified for the assembly circuit.

8. The assembly according to claim 7, wherein the adjustment circuit includes:
an adjustment resistor connected in series with the secondary coil, the resistance value of the adjustment resistor is dimensioned such that the assembly circuit has a specified total resistance, and/or
an adjustment capacitor connected in parallel with the secondary coil, the capacitance value of the adjustment capacitor is dimensioned such that the assembly circuit has a specified total capacitance.

9. The assembly according to claim 1, wherein the assembly circuit further includes a circuit connected downstream of the secondary coil, wherein the circuit is designed in such a way that it effects a limitation of current, voltage, and/or power and wherein the circuit is designed in such a way that it causes at least one electrical property of the assembly circuit to have a value specified for the assembly circuit.

10. A field device, comprising:
an assembly, including:
a coil carrier; and an assembly circuit arranged on the coil carrier, the assembly circuit including:
a secondary coil; and
at least one electronic component electrically connected to the secondary coil via conductive lines,
wherein the coil carrier includes a cylindrical carrier region carrying the secondary coil, where the cylindrical carrier region has a shape adapted to a shape of an interface housing of the field device used to receive the secondary coil,
wherein the coil carrier includes at least one extension adjoining the cylindrical carrier region thereof, and including the at least one electronic component or including a mounting surface including the at least one electronic component, and wherein the assembly includes contact pins that are connected to the assembly circuit via lines arranged at least in sections on or in the coil carrier and that are encapsulated with plastic or are extrusion-coated with plastic, via which the assembly circuit can be connected to the electronics of the field device; electronics connected to the assembly; and
an inductive interface via which the field device can be connected to an inductive interface of a superordinate unit comprising a primary coil, wherein the inductive interface includes the interface housing into which the assembly is inserted in such a way that the field device can be connected to the superordinate unit via the inductive interface of the field device and the inductive interface of the superordinate unit such that the secondary coil of the assembly, together with the primary coil of the inductive interface of the superordinate unit, form a transformer for transmitting data and energy.

11. The field device according to claim 10, wherein the electronics include a printed circuit board which is arranged in an electronics housing and is equipped with electronic components on one side or on both sides of the printed circuit board, wherein an interior of the electronics housing is directly adjacent to an interior of the interface housing, and wherein the assembly includes:

contact pins having conductive ends connected to terminal contacts provided on the printed circuit board and/or soldered onto the terminal contacts by soldering joints also serving to mechanically fasten the printed circuit board, at least one extension which extends into the electronics housing and is equipped with at least one component of the assembly circuit and has a shape adapted to a shape of the electronics housing, and/or a plug-in device into which the printed circuit board is inserted.

12. The field device according to claim 11, wherein the assembly includes at least one extension which extends parallel to the printed circuit board into the electronics housing and has a mounting surface equipped with at least one component of the assembly circuit on a side facing the printed circuit board.

13. The field device according to claim 11, wherein the inductive interface of the field device includes a connecting element which can be mechanically connected to a complementary connecting element of the inductive interface of the superordinate unit in such a way that an inductive coupling exists via the secondary coil of the assembly arranged in the connecting element of the field device and the primary coil arranged in the connecting element of the superordinate unit, and/or wherein the interior of the electronics housing and/or an adjoining interior of the interface housing is encapsulated with resin.

14. A method for manufacturing one or more field devices according to claim 10, the method comprising:

prefabricating a number of assemblies corresponding to the number of field devices by manufacturing their coil carrier including the secondary coil arranged on the coil carrier and the conductive lines required for connecting the at least one component of an assembly circuit; equipping the coil carrier with the at least one electronic component; inserting each assembly into the respective field devices; and connecting the assembly circuit to the electronics of the field device.

15. The method according to claim 14, further comprising:

carrying out an adjustment method within the framework of the manufacture of the assembly, wherein a total value of at least one electrical property of the assembly circuit is adjusted by a corresponding dimensioning of one of the at least one component of the assembly circuit which serves as an adjustment element for adjusting the respective electrical property of the assembly and is to be arranged on its coil carrier, wherein the dimensioning is performed such that it is equal to a value specified for the respective assembly, and wherein the at least one electrical property of the assembly circuit includes a total resistance of the assembly circuit and/or a total capacitance of the assembly circuit.

16. The method according to claim 15, wherein in the manufacturing of multiple field devices, the procedure is such that identical electronics are prefabricated, identical assemblies adjusted by means of the adjustment method are prefabricated, and the adjusted assemblies are each used directly in one of the field devices in combination with one of the identical electronics without the respective electronics being adapted to the respective assembly.

* * * * *